United States Patent
Choi et al.

(10) Patent No.: US 7,637,114 B2
(45) Date of Patent: Dec. 29, 2009

(54) TEMPERATURE-ADJUSTING UNIT, SUBSTRATE PROCESSING APPARATUS WITH THE UNIT, AND METHOD OF REGULATING TEMPERATURE IN THE APPARATUS

(75) Inventors: Dong-Hyun Choi, Gyeonggi-do (KR); Moon-Soo Park, Gyeonggi-do (KR); Jong-Chul Kin, Gyeonggi-do (KR); Yong-Dae Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 580 days.

(21) Appl. No.: 11/438,006

(22) Filed: May 19, 2006

(65) Prior Publication Data

US 2006/0266060 A1    Nov. 30, 2006

(30) Foreign Application Priority Data

May 30, 2005   (KR) .................. 10-2005-0045711

(51) Int. Cl.
- F25B 49/00 (2006.01)
- F25B 41/04 (2006.01)
- A47F 3/04 (2006.01)
- F28D 15/00 (2006.01)
- C23C 16/00 (2006.01)
- H05K 7/20 (2006.01)

(52) U.S. Cl. .................. 62/196.4; 62/205; 62/259.2; 165/104.33; 118/725; 361/690

(58) Field of Classification Search ............... 62/205, 62/259.2, 179, 196.4, 199; 165/104.33; 236/1 C; 361/690, 668; 118/725
See application file for complete search history.

(56) References Cited

U.S. PATENT DOCUMENTS

| | | | |
|---|---|---|---|
| 4,606,198 A * | 8/1986 | Latshaw et al. | 62/205 |
| 6,091,060 A * | 7/2000 | Getchel et al. | 219/483 |
| 6,672,089 B2 * | 1/2004 | Park et al. | 62/199 |
| 6,993,919 B2 * | 2/2006 | Hirooka et al. | 62/115 |
| 7,000,416 B2 * | 2/2006 | Hirooka et al. | 62/259.2 |

FOREIGN PATENT DOCUMENTS

| | | |
|---|---|---|
| JP | 2001-153518 | 6/2001 |
| JP | 2001-244179 | 9/2001 |
| KR | 10-1998-0066300 A | 10/1998 |
| KR | 1020010052009 | 6/2001 |
| KR | 10-2002-0073937 A | 9/2002 |
| KR | 1020050013822 | 2/2005 |
| WO | WO 2005/043609 A1 | 5/2005 |

* cited by examiner

Primary Examiner—Chen-Wen Jiang
(74) Attorney, Agent, or Firm—Myers Bigel Sibley & Sajovec

(57) ABSTRACT

A substrate processing apparatus includes: a processing room in which a semiconductor substrate may be treated by a process; a cooling unit positioned to cool the processing room, the cooling unit configured to convey cooling fluid; and a temperature-adjusting unit that alters the temperature of the cooling fluid supplied into the cooling unit. The temperature-adjusting unit has a cycling circuit. The cycling circuit has a compressor configured to compress a refrigerant, a condenser configured to condense the compressed refrigerant, an expander configured to expand the condensed refrigerant, the expander including a plurality of expansion valves arranged in parallel, and an evaporator configured to evaporate the expanded refrigerant, the evaporator positioned to cool the cooling fluid.

27 Claims, 6 Drawing Sheets

TEMPERATURE-ADJUSTING UNIT, SUBSTRATE PROCESSING APPARATUS WITH THE UNIT, AND METHOD OF REGULATING TEMPERATURE IN THE APPARATUS

RELATED APPLICATION

This U.S. non-provisional patent application claims priority under 35 U.S.C. § 119 to Korean Patent Application 2005-45711 filed on May 30, 2005, the entire contents of which are hereby incorporated by reference.

FIELD OF THE INVENTION

The present invention relates to apparatus and methods for manufacturing semiconductor devices. In particular, the present invention relates to a temperature-adjusting unit for altering the temperature of cooling fluid, a substrate processing apparatus including the temperature-adjusting unit, and a method of regulating temperature in the apparatus.

BACKGROUND

Semiconductor chips are manufactured by repeating many processing steps such as depositing, exposing, etching, and polishing on semiconductor substrates such as wafers. Specific conditions are suitable for the processing steps. The processing conditions include the processing environments for wafers during operations or in processing rooms. Important processing conditions include the wafer temperature during processing operations, temperature and pressure in processing chambers, high-frequency power applied to electrode plates, and quantities of processing gases. Insufficient processing condition and lack of stability may raise the rates of defects on semiconductor chips. For example, if a dry etching process is carried out in conditions outside the suitable range, degradation of etch rate and uniformity may occur.

Temperature-adjusting units such as chillers are usually employed to meet the temperature requirements for processing. Chillers function to maintain constant wafer temperature by cooling down an electrode plate or heating up a chamber during processing, preventing wafer breakage and processing failure due to hot temperature.

Chillers have a compressor, a condenser, an expansion valve, and an evaporator in which thermal exchange occurs between a refrigerant and cooling fluid. The amount of refrigerant supplied into the evaporator is variable in accordance with the kind of expansion valve, which affects the temperature of the cooling fluid a great deal. The processing temperature required in a processing chamber also varies in accordance with kinds of processing steps. For example, in an etching process, the processing temperature varies with the type of film material to be etched. When the material to be etched is an oxide, the wafer temperature is typically maintained at about −30° C. When the material to be etched is polycrystalline silicon, the wafer temperature is typically maintained at about 20° C. If the material to be etched is a metal, the wafer temperature is typically maintained at about 60° C.

A semiconductor chip is completed by depositing oxide films, polysilicon films, and metal films several times. Even with the same kinds of materials to be etched, the processing temperature may vary depending on sequential steps of deposition and correlations with lower films. Furthermore, there are large gaps of temperature among processing steps such as exposing, depositing, and etching in the processing chambers.

In handling a general apparatus, when the material to be etched changes, an operator exchanges the expansion valve for a new one that is adaptable to the processing temperature corresponding to the changed material, by way of a tuning operation on the chiller. However, the tuning results on the chillers may deviate with the individual operator, which reduces uniformity and reliability in processing the wafers. Thus, the practical processing steps typically cannot begin until after confirming whether the tuning operations have been properly accomplished in correspondence with the requirements for the processing conditions, resulting in degradation of the rate of operation.

Additionally, when high-frequency power is applied to a processing chamber, the temperature in the processing chamber may be affected by the high-frequency power. Since the tuning operations on the chillers are generally carried out without considering various factors influencing the processing steps, wafers may be put through processing steps without maintaining the appropriate processing temperature.

Furthermore, as the temperature of the processing chamber is regulated only by varying the amount of refrigerant supplied into the evaporator through the expansion valve during a process, it can be difficult precisely and accurately adjust the temperature of cooling fluid.

SUMMARY OF THE INVENTION

As a first aspect, embodiments of the present invention are directed to a substrate processing apparatus comprising: a processing room in which a semiconductor substrate may be treated by a process; a cooling unit positioned to cool the processing room, the cooling unit configured to convey cooling fluid; and a temperature-adjusting unit that alters the temperature of the cooling fluid supplied into the cooling unit. The temperature-adjusting unit has a cycling circuit comprising: a compressor configured to compress a refrigerant; a condenser configured to condense the compressed refrigerant; an expander configured to expand the condensed refrigerant and including a plurality of expansion valves arranged in parallel; and an evaporator configured to evaporate the expanded refrigerant and positioned to cool the cooling fluid.

As a second aspect, embodiments of the present invention are directed to a substrate processing apparatus comprising: a processing room in which a semiconductor substrate is treated by a process; a cooling unit positioned to cool the processing room and configured to convey cooling fluid; a cycling circuit configured to compress, condense, expand, and evaporate a refrigerant and positioned to alter the temperature of the cooling unit; an adjuster configured to control operational conditions of the cooling unit; and a controller configured to transfer control information to the adjuster. The controller comprises a memory device configured to store a plurality of data sets, each of which includes processing conditions and control information to control the cycling circuit, the control information corresponding to processing conditions of the processing room.

As a third aspect, embodiments of the present invention are directed to a method of regulating temperature in a substrate processing apparatus, the method comprising: establishing a plurality of data sets, each of which includes processing conditions and control information to control operational conditions of a cycling circuit that alters temperature of cooling fluid supplied into a processing room in accordance with each processing condition; inputting processing data relevant to a process conducted in the processing room; identifying the data set that includes the processing condition corresponding to the processing data; transferring the control data of the identified data set to an adjuster controlling the cycling circuit; adjusting the operational condition of the cycling circuit with the adjuster in accordance with the transferred control information; and supplying the cooling fluid, which has exchanged heat with a refrigerant of the cycling circuit, into the processing room and conducting the process for a semiconductor substrate in the processing room. As a fourth aspect, embodiments of the present invention are directed to a temperature-adjusting unit used in a substrate processing apparatus, comprising: a compressor configured to compress a refrigerant; a condenser configured to condense the compressed refrigerant; a plurality of expansion valves arranged in parallel to expand the condensed refrigerant; and an evaporator configured to evaporate the expanded refrigerant by way of heat exchange with cooling fluid employed in a process external to the temperature adjusting unit. The expansion valves are selectively used in accordance with temperature required by cooling fluid.

DETAILED DESCRIPTION OF EMBODIMENTS OF THE INVENTION

Figure 1:
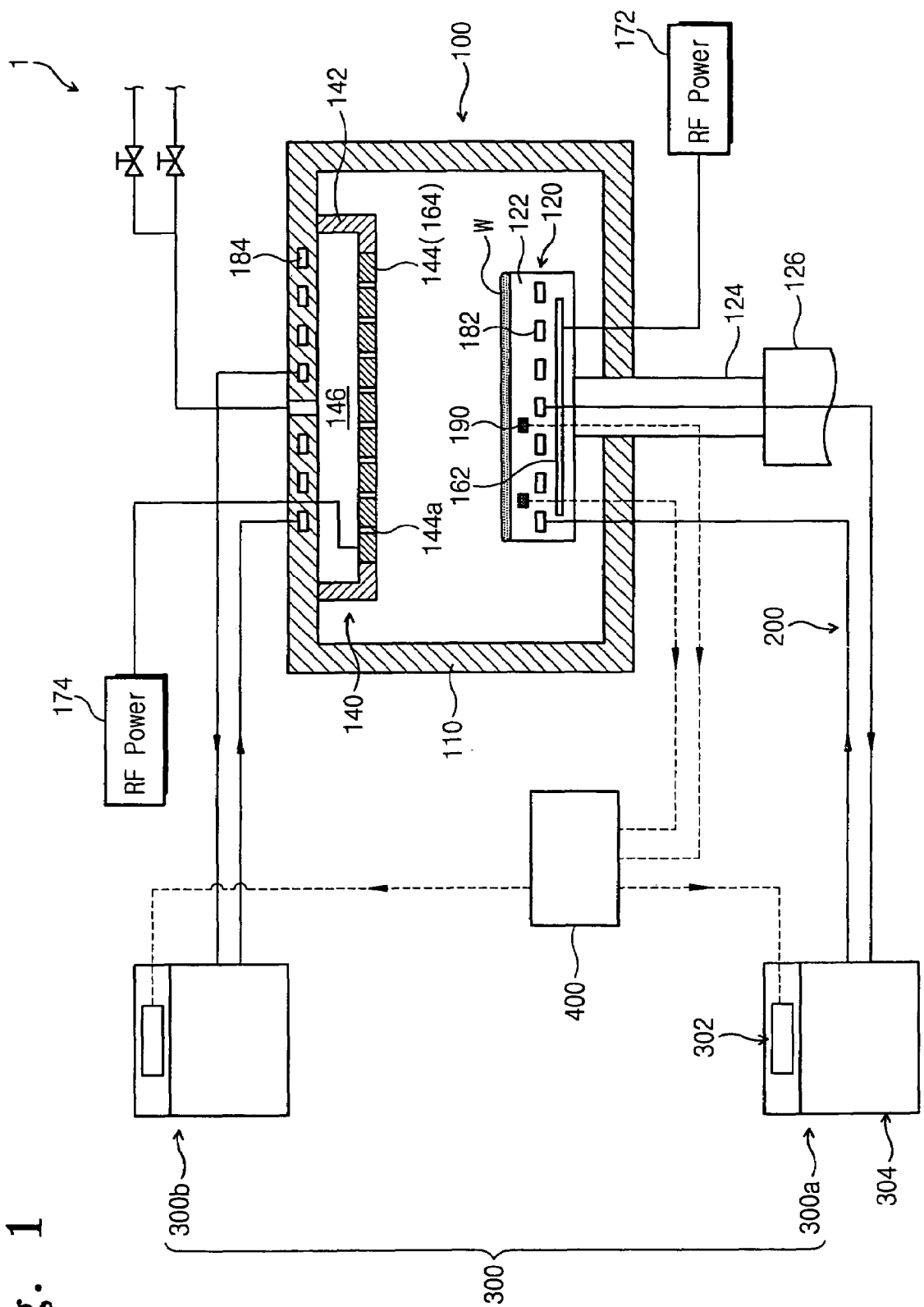
FIG. 1 is a schematic diagram illustrating a substrate processing apparatus according to embodiments of the present invention.

The present invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like reference numerals refer to like parts throughout the various figures unless otherwise specified.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Hereinafter, it will be described about an exemplary embodiment of the invention in conjunction with the accompanying drawings FIGS. 1-6.

The embodiments according to the invention are exemplarily illustrated with relevant to an apparatus for etching films on a semiconductor substrate, but is not limited thereto. The invention may be applicable to other types of processing apparatus for exposing or depositing films on a semiconductor substrate in a reaction chamber, utilizing cooling fluid to maintain or regulate processing temperature for the substrate or reaction chamber therein.

FIG. 1 is a schematic diagram illustrating a substrate processing apparatus 1 according to embodiments of the present invention. Referring to FIG. 1, the apparatus 1 comprises a processing room 100, a cooling fluid line 200, and a temperature-adjusting unit 300.

The processing room 100 provides a space where an etching process is carried out to etch a film of material from a semiconductor substrate. The processing room 100 includes a processing chamber 110, a supporting member 120, and an ejecting member 140. The chamber 110 is hermetically sealed from the external environment, providing a space for accommodating a wafer W.

The supporting member 120 is disposed on a lower side in the chamber 110, fixing the wafer W thereto during the etching process. The supporting member 120 is configured with a supporting plate 122 on which the wafer W is laid, and a supporting axis 124 that links downward to the supporting plate 122 and is rotatable by a motor. The supporting plate 122 is circular in shape. There are various methods to set the wafer W on the supporting plate 122, such as mechanical methods, vacuum suction, or electrostatic attraction.

The ejecting member 140 is positioned at the upper side in the chamber 110 opposite the supporting member 120. The ejecting member 140 is connected to the chamber 110 in a manner that provides a space 146 between the ceiling of the chamber 110 and the ejecting member 140. For instance, the ejecting member 140 comprises a ring-shaped sidewall 142 that connects to the ceiling of the chamber 110, and an ejection plate 144 that is positioned at the bottom of the sidewall 142 and that has a plurality of ejection holes 144a.

A bottom electrode 162 is provided in the supporting member 120. A top electrode 164 to which high-frequency power is applied is associated with the ejecting member 140. The bottom electrode 162 is usually formed of a metal plate, while the ejection plate 144 may be used as the top electrode 164. Power supply sources 172 and 174 apply high-frequency power to the bottom and top electrodes 162 and 164 respectively, generating plasma from the processing gas supplied into the chamber 110 and inducing the generated plasma onto the wafer W. The high-frequency power may be radio frequency (RF) energy.

Depending on the qualities of film materials to be etched, the required wafer temperature and the rate, time, and period for the application of high-frequency power to the top and bottom electrodes 164 and 162 differ. The qualities of the film materials to be etched correspond to the processing steps and the lower films. For example, a film material may be an oxide film, a polysilicon film, or a metal film. Even with multi-leveled films with the same kind of material, those film materials may have different processing steps on the wafer W.

Cooling lines 182 and 184, through which cooling fluid flows, are provided to the supporting and ejecting members 120 and 140 to provide a temperature condition required by the wafer W and the chamber 110 during the etching process. The cooling fluid may be cooling water. Cooling lines 182 and 184 may be located in the supporting or ejecting member 120 or 140, or disposed adjacent to them. As an example, the cooling line 184 is positioned in the ceiling of the chamber 110 and the other cooling line 182 is positioned in the higher portion of the bottom electrode 162 in the supporting member 120.

The temperature-adjusting unit 300 regulates the temperature of the cooling fluid. The temperature-adjusting unit 300 may comprise a first regulator 300a that regulates the temperature of the cooling fluid supplied to the supporting member 120 through the cooling line 182, and a second regulator 300b that regulates the temperature of the cooling fluid supplied to the ejecting member 140 through the cooling line 184. In addition, the apparatus 1 may include cooling lines in the chamber 110 that regulate the temperature of the outer walls of the chamber 110 and a third regulator may regulate the temperature of the cooling fluid supplied through the cooling lines of the outer walls. The first regulator 300a may have the same structure as the second regulator 300b. The temperature-adjusting unit 300 may be a chiller. An exemplary apparatus 1 that employs a chiller as the temperature-adjusting unit 300 will now be described in conjunction with the present embodiment of the present invention.

Figure 2:
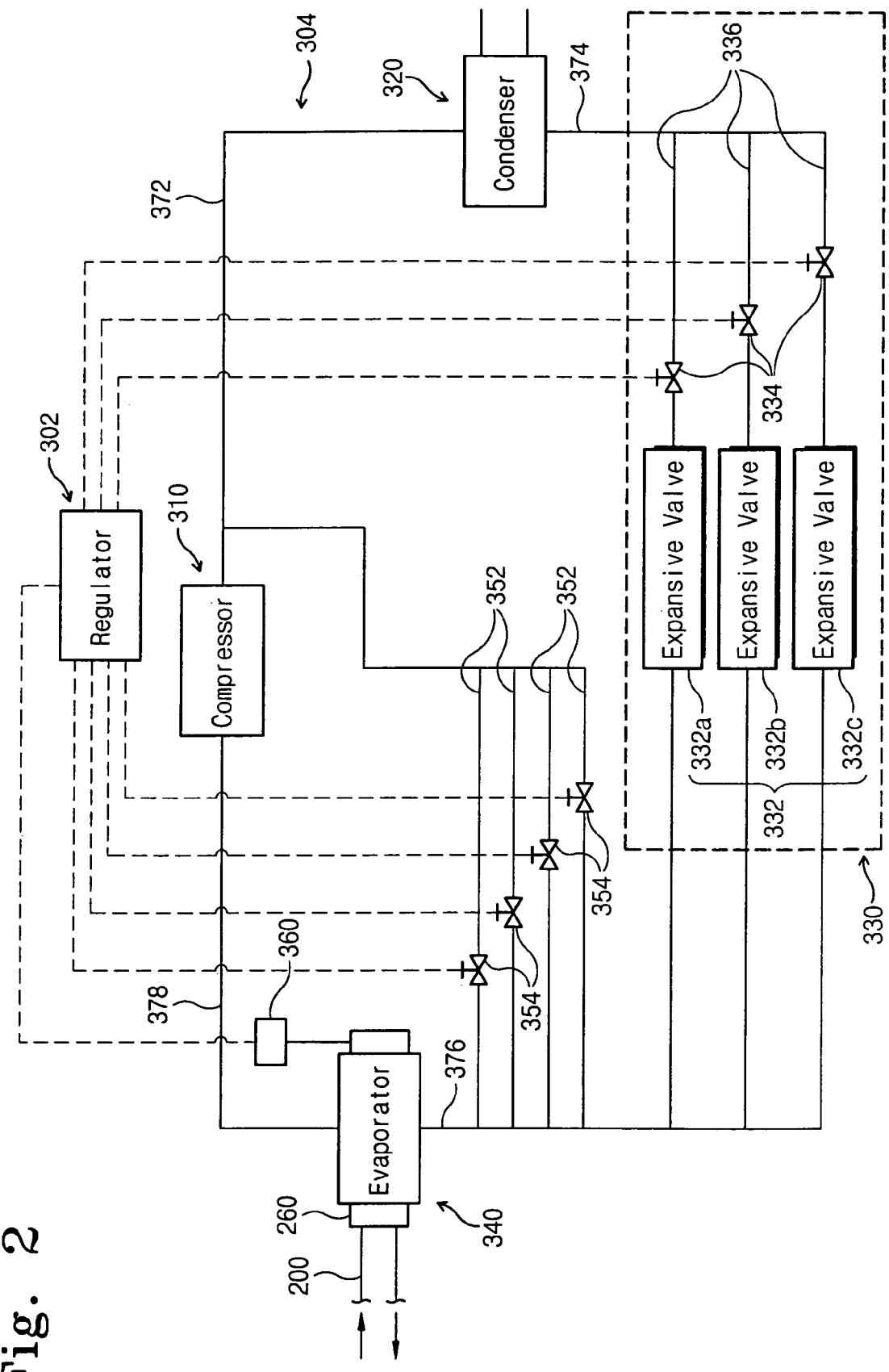
FIG. 2 is a circuit diagram illustrating a functional structure of the temperature-adjusting unit shown in FIG. 1.

FIG. 2 is a circuit diagram illustrating the functional structure of the temperature-adjusting unit 300 shown in FIG. 1. Referring to FIG. 2, the temperature-adjusting unit 300 includes an adjuster 302 and a cycling circuit 304. The cycling circuit 304 comprises a compressor 310, a condenser 320, an expander 330, and an evaporator 340. The compressor 310, the condenser 320, the expander 330, and the evaporator 340 form a closed loop circuit by way of connection lines 372, 374, 376, and 378 through which a refrigerant flows. The refrigerant is compressed to a high temperature and pressure by external heat in the compressor 310. The high temperature and pressure refrigerant gas from the compressor 310 is liquidized by discharging the condensed heat through the condenser 320. The condensed refrigerant partially evaporates via a throttling operation while passing through expansion valves 320 and becomes a liquid refrigerant with low temperature and pressure. Then, evaporation of the liquid refrigerant from the evaporator 340 takes away latent heat and generates a chilling effect, and the refrigerant flows into the compressor 310. The refrigerant may be a hydrofluorocarbon (HFC).

The cooling fluid is supplied into the cooling lines 182 and 184 by way of a cooling fluid line 200 that leads to a tank 260. The evaporator 340 takes away the latent heat from the cooling fluid held in the tank 260. The evaporator 340 is disposed in or adjacent to the tank 260. A heater 360 is further provided to apply heat to the cooling fluid contained in the tank 260, to alter the temperature of the cooling fluid, when the temperature of the cooling fluid decreases from the heat exchange with the refrigerant flowing through the evaporator 340.

The heater 360 also supplies heat to the processing chamber 110 in correspondence with processing temperature in the chamber 110, maintaining a constant processing temperature. A temperature sensor 190 is installed in the processing chamber 110 to evaluate the actual temperature. For example, if the processing temperature corresponds to the temperature on the wafer W, the sensor 190 is installed at a position (or the center or edge) adjacent to the wafer W on the supporting member 120 in order to correctly measure current temperature of the wafer W. A plurality of temperature sensors 190 may be provided to measure the temperature at different locations (e.g., to measure the temperature at the center and edges). The heater 360 operates under a closed-loop control scheme, which may be a proportional integral derivative control mode.

The expander 330 may have a plurality of expansion valves 332a, 332b, and 332c that are arranged in parallel. Branches 336, which connect the expansion valves to the condenser 320, are associated with valves 334 that open and close the internal paths of the branches. The valves 334 may be solenoid types controllable by electrical signals. The expansion valves 332 may have different capacities to supply refrigerant fluid to the evaporator 340. The expansion valves 332 may be different kinds depending on the quality of film material to be etched in the processing chamber 110. During the etching process, it is possible to use a single expansion valve 332 or to selectively use a plurality of expansion valves 332.

As an example, the expander 330 comprises a first expansion valve 332a capable of passing the largest amount of refrigerant, a second expansion valve 332b capable of passing an intermediate amount of refrigerant, and a third expansion valve 332c capable of passing the least amount of refrigerant. The first expansion valve 332a, suitable for a large amount of refrigerant, may be utilized to conduct a process under low temperature (e.g., an etching process for an oxide film). The second expansion valve 332b, suitable for an intermediate amount of refrigerant, may be utilized to conduct a process under normal temperature (e.g., an etching process for a polysilicon film). The third expansion valve 332c, suitable for a small amount of refrigerant, may be utilized to conduct a process under high temperature (e.g., an etching process for a metal film).

It is possible for each of the expansion valves 332 to supply the same flux of refrigerant into the evaporator 340. In this embodiment, the number of expansion valves 332 varies depending on the quality of film material to be processed.

For example, when the expander 330 has three expansion valves 332, each designed to pass the same amount of refrigerant, the etching process under low temperature may need all three expansion valves 332. An intermediate-temperature etching process may use two of the expansion valves 332, and a low-temperature etching process may use just one of the expansion valves 332.

In addition, according to the invention, refrigerant vapor lines 352 are provided to directly link a line 372, which connects the compressor 310 to the condenser 320, with a line 376, which connects the expander 330 to the evaporator 340. The refrigerant vapor lines 352 supply some of the refrigerant compressed vapor into the evaporator 340 from the compressor 310 without passing though the condenser 320 and the expander 330. The amount of refrigerant vapor supplied through the refrigerant vapor line 352 affects the temperature of the cooling fluid that exchanges heat with the refrigerant in the evaporator 340. When more refrigerant vapor is supplied into the evaporator 340, the latent heat toward the refrigerant from the cooling fluid decreases.

The plurality of refrigerant vapor lines 352 are arranged in parallel. The refrigerant vapor lines 352 are associated with valves 354 that open and close the internal paths of the refrigerant vapor lines 352. The valves 354 of the refrigerant vapor lines 352 may be solenoid types controllable by electrical signals.

According to some embodiments of the present invention, the refrigerant vapor lines 352 have the same diameter and vary in number depending on the processing steps. For example, the number of the refrigerant vapor lines 352 used decreases when there is a need for descending temperature of the cooling fluid, while the refrigerant vapor lines 352 used increases when there is a need for ascending temperature of the cooling fluid.

In other embodiments of the present invention, the refrigerant vapor lines 352 are different in diameter and selectively adopted depending on the processing steps. The refrigerant vapor lines 352 may be used individually or plurality. For example, a small diameter refrigerant vapor line 352 may be used when there is a need for descending temperature of the cooling fluid, while a large diameter refrigerant vapor line 352 may be used when there is a need for ascending temperature of the cooling fluid.

With the number and kinds of the expansion valves 322, it is possible to adjust the temperature of the cooling fluid over a wide range. With the number and kinds of the refrigerant vapor valves 352, it is possible to adjust the temperature of the cooling fluid over a small range.

The adjuster 302 controls open/shut operations of the valves 334 and the valves 354. The adjuster 302 also regulates the quantity of heat applied to the tank 260 from the heater 360.

Because the temperature-adjusting unit 300 operates over a wide range (i.e., all over the high, intermediate, and low temperature), it is possible to use the apparatus of the present invention for various materials that require different temperature conditions for the etching process. Thus, the apparatus has excellent processing capabilities.

In some embodiments, the present invention provides means to automatically select operational conditions of the cycling circuit 304 in accordance with processing temperature and processing type. The processing temperature is corresponds to the temperature of the chamber 110 or the wafer W. The processing type is configured to include data about the qualities of film materials to be etched in the chamber 110. Further, the operational conditions of the cycling circuit 304 affect the amount and properties of the refrigerant supplied into the evaporator 340. Thus, the apparatus 1 may comprise a controller 400 for providing control information 422b, which contains data about the operational conditions of the cycling circuit 304, to the adjuster 302 in accordance with processing temperature. The controller 400 sends the control information 422b to the adjusters 302 associated with the first and second regulators 300a and 300b.

Figure 3:
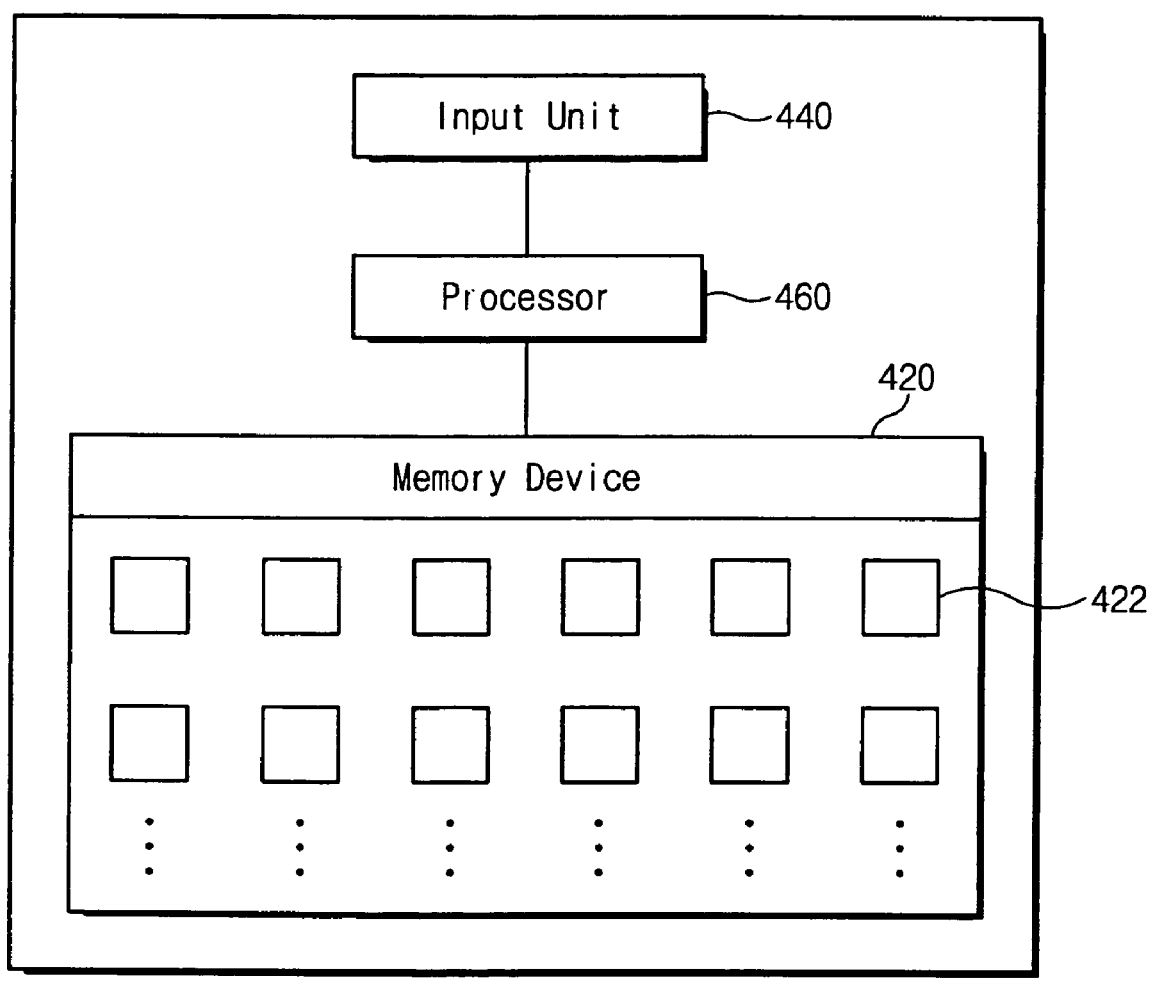
FIG. 3 is a block diagram illustrating the controller shown in FIG. 1.

FIG. 3 is a block diagram that illustrates the controller 400 shown in FIG. 1. Referring to FIG. 3, the controller 400 comprises a memory device 420, an input unit 440, and a processor 460.

Figure 4:
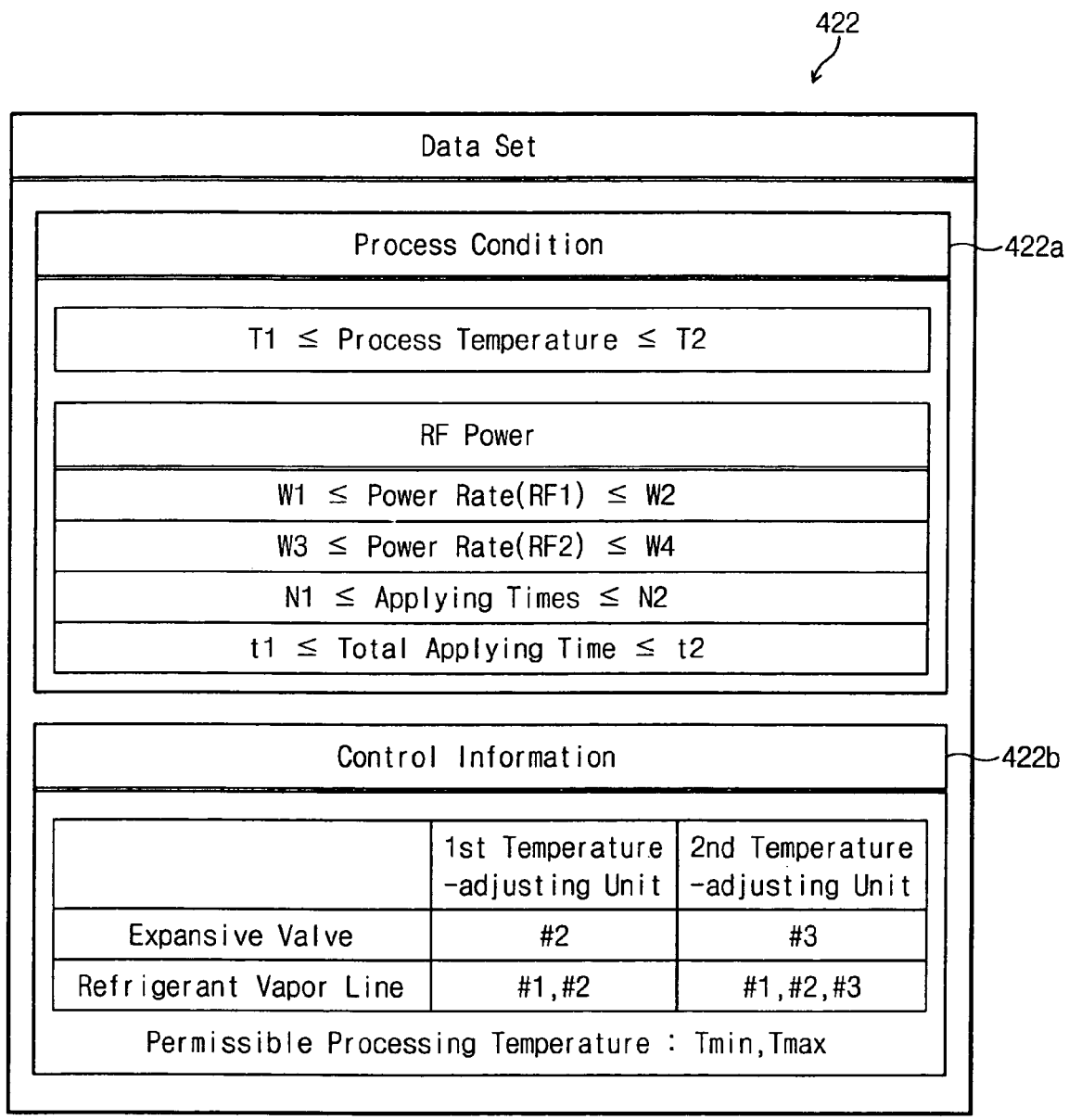
FIG. 4 is a diagram showing a configuration of the data set by the controller.
Figure 5:
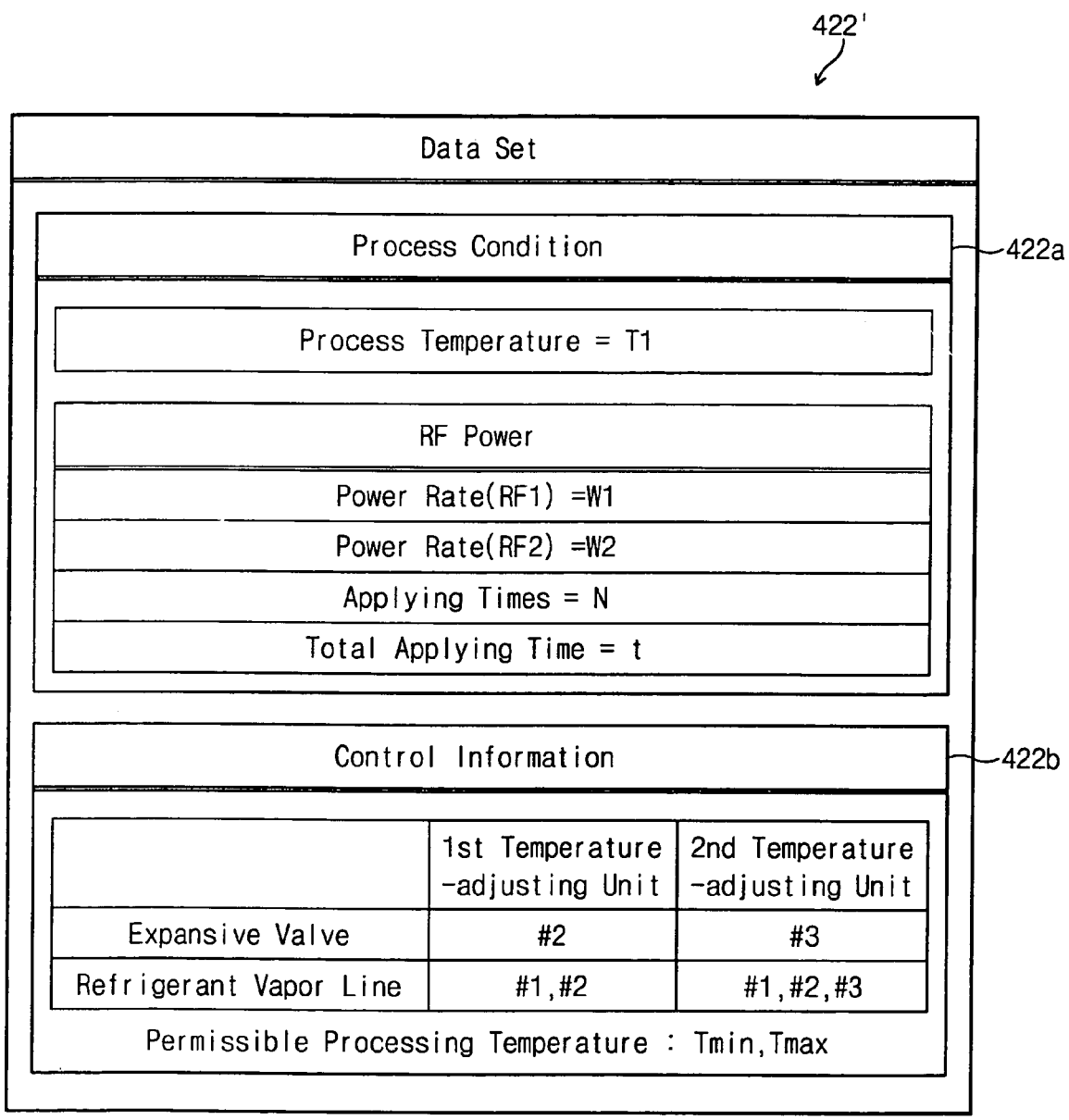
FIG. 5 is a diagram showing another configuration of the data set by the controller.

The memory device 420 has a plurality of data sets 422, each of which contains the processing condition data 422a and the control information 422b that is provided to control the cycling circuit 304 on basis of the processing condition data 422a. FIGS. 4 and 5 show schematic configurations of the data sets 422 and 422' by the controller.

The processing condition data 422a include the information about processing temperature required in the etching process. The processing temperature may be relevant to temperature at a specific position or for a specific construction. In some embodiments of the present invention, the temperature on the wafer W is provided as the processing temperature. The processing condition data 422a includes items about the wafer temperature required in the etching process, and about the high-frequency power applied during the etching process. The item about the high-frequency power further includes the high-frequency power applied, the number of times of applying the high-frequency power during the etching process, and the total period of applying the high-frequency power during the etching process. These items may be arranged as factors that affect the temperature of the processing chamber 110 during the etching process, but it is permissible to remove some of these items or factors or to add other items or factors.

The control information 422b includes items about the expansion valves 332 employed in the first and second regulators 300a and 300b, items about the refrigerant vapor lines 352, and the quantity of heat applied from the heater 360.

In the processing chamber 110, the high-frequency power periodically turns on and off. While the power is being disabled, the temperature of the processing chamber 110 drops. In this situation, the temperature of the cooling fluid may be raised to maintain the temperature of the wafer W. As the heater 360 is controlled in the proportional integral derivative mode along the processing temperature measured from the processing chamber 110 by the sensor 190, the temperature of the wafer W is regulated to the desired temperature. When the high-frequency power is shut off, the processing temperature of the chamber 110 varies a great deal from the desired temperature. Thus, it takes a long time to recover the processing temperature up to the predetermined temperature. The item about the heat applied from the heater 360 is prepared to prevent the aforementioned problem, having information about variation of the quantity of heat along progressing time of the etching process. Namely, the heat applied from the heater 360 is preliminarily regulated to a proper quantity before turning the high-frequency power on or off, preventing the temperature of the wafer W from being higher due to the on/off conduction of the high-frequency power. The control information 422b corresponding to the processing conditions 422a is predetermined through experimental works.

Processing defects can occur due to a difference between actual temperature of the wafer W and the temperature required on the wafer W. Thus, the control information 422b may further include an item about a range of processing temperature required for the progress of the etching process.

The plurality of data sets 422 include information about different processing conditions 422a. According to one embodiment, the expander 330 comprises the three expansion valves 332, four refrigerant vapor lines 352 are provided, and one of the data sets 422 includes the information about the processing condition 422a and the control information 422b as shown in FIG. 4. Referring to FIG. 4, it is possible to arrange data relevant to the usage with the expansion valves 332 and the refrigerant vapor lines 352, among the control information 422b. It is also possible to arrange data about the processing condition 422a and the permissible processing temperature in detailed patterns. When the etching process is carried out under the processing condition 422a provided by the data set 422 shown in FIG. 4, the expansion of the refrigerant is enabled only through the second expansion valve 332b in the first regulator 300a, and some of the refrigerant passing through the compressor 310 is supplied directly into the evaporator 340 through the first and second refrigerant vapor lines. In the second regulator 300b, the expansion of the refrigerant is enabled only through the third expansion valve 332c, and some of the refrigerant passing through the compressor 310 is supplied directly into the evaporator 340 through the first, second, and third refrigerant vapor lines. The etching process is interrupted when the processing temperature is lower than the minimum degree $T_{min}$ or higher than the maximum $T_{max}$.

The data set 422 is able to contain the information about the processing condition 422a that is provided with a predetermined range as shown in FIG. 4. Otherwise, the data set 422' is configured with the information about the processing condition 422a' that is provided with a specific value as shown in FIG. 5.

The input unit 440 accepts data about the processing condition 422a (i.e., processing data) changed in the processing chamber 110 when there is variation in a film material to be etched. The processing data includes items about the processing condition 422a of the data set 422. It is preferable for the processing data to include all the items of the processing condition 422a, but it is possible for the processing data to include only some of them. When there is a change of the processing condition 422a, the input unit 440 accepts the processing data about processing temperature, high-frequency power rate, number of times of applying the high-frequency power, and total period of applying the high-frequency power in accordance with the changed processing condition 422a.

The processor 460 finds a corresponding data set 422, to be used in controlling the cycling circuit 304, in accordance with the input processing data. As shown in FIG. 4, if the items of the processing condition 422a are stored in ranges, the processor 460 finds a corresponding one of the data sets 422 that includes the processing condition 422a with the range covering the input processing data. If no data set 422 includes the processing condition 422a with the range covering the input processing data, the processor 460 finds another one of the data sets 422 that includes the processing condition 422a closest to the input processing data. Alternatively, the processor 460 is able to provide a message "no data set corresponding to current processing condition" on a display unit. As shown in FIG. 5, when items of the processing condition 422a are stored with specific values, the processor 460 finds a corresponding one of the data sets 422 that includes the processing condition 422a identical to the input processing data. If no data set 422 includes the processing condition 422a identical to the input processing data, the processor 460 finds another one of the data sets 422 that includes the processing condition 422a closest to the input processing data.

An operator is able to increase the number of the data sets 422 in accordance with different qualities of film materials to be etched. Further, an operator is able to extend the number or kinds of the expansion valves 332 and the refrigerant vapor lines 352 to enlarge the range of processing temperature and obtain fine control of temperature under the established temperature range. Thus, an operator need not conduct tuning operations such as the replacement of the expansion valves 332 even when there is a variation in the processing temperature required by the processing chamber 110 by a change of the film material to be etched.

Figure 6:
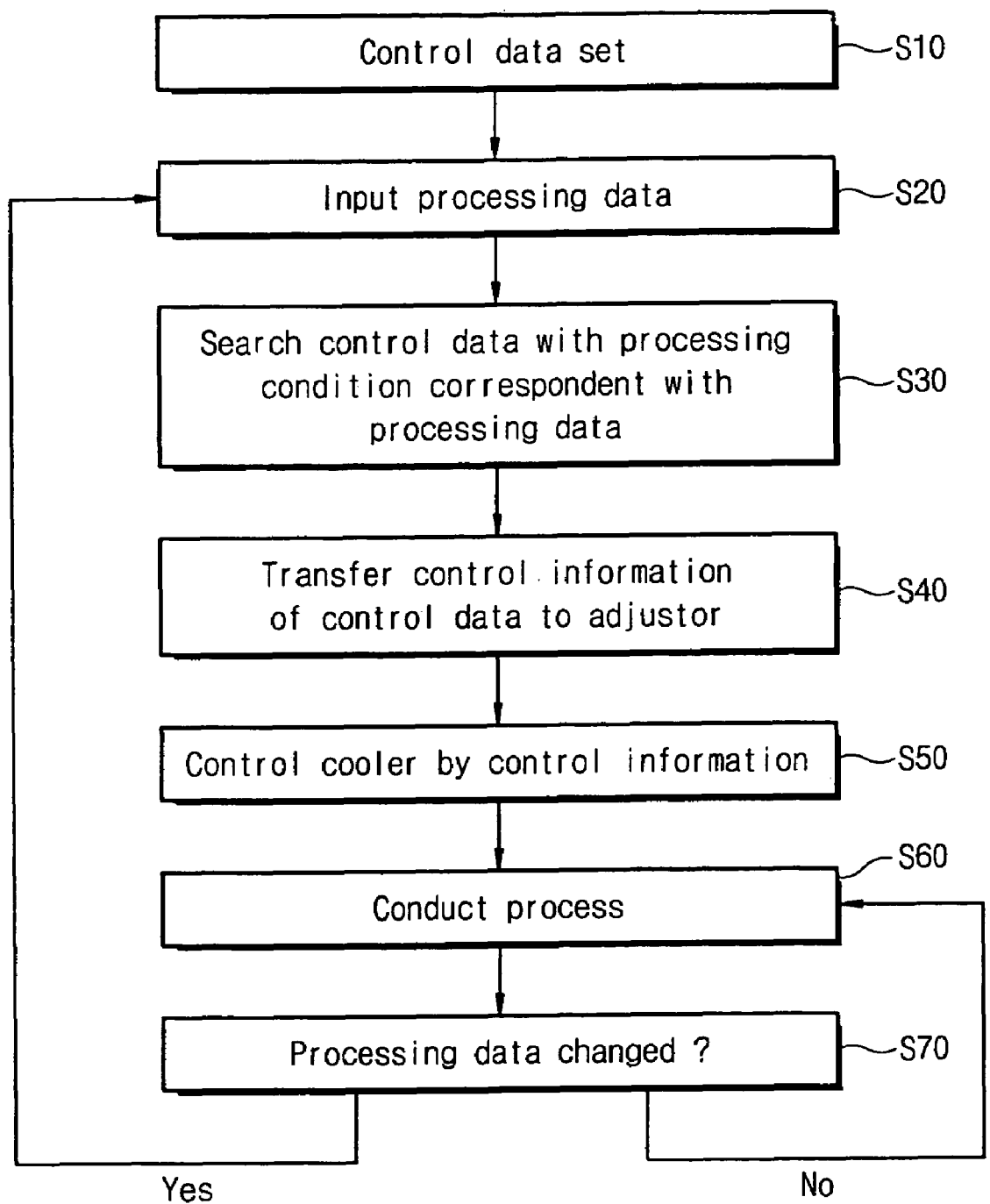
FIG. 6 is a flow chart showing a method of regulating temperature in the substrate processing apparatus.

FIG. 6 shows a procedure of regulating the temperature in the substrate processing apparatus 1. First, it establishes the processing conditions 422a and the plurality of the data sets 422 that include the control information 422b corresponding to the processing conditions 422a, by way of experimental works (step S10). An operator inputs data about information of the processing conditions carried out in the processing chamber 110 (step S20). The processor 460 finds a corresponding one of the data sets 422 that agrees with the processing data input by the operator or includes the most similar processing conditions 422a (step S30). The control information 422b included in the data set 422 found by the processor 460 is transferred to the adjusters 302 of the first and second regulators 300a and 300b (step S40).

The adjuster 302 controls the cycling circuit 304 and selects the expansion valves 332 and the refrigerant vapor lines 352 in accordance with the control information 422b (step S50). Then, the etching process is carried out on the wafer W in the processing room 100 (step S60). The temperature sensor 190 measures the temperature on the wafer W in real time, from which the measured data of temperature is transferred to the adjusters 302. The adjuster 302 minutely varies the quantity of heat applied from the heater 360 to maintain the temperature of the wafer W at the required processing temperature. When the temperature of the wafer W is out of the permissible range of processing temperature, it interrupts the progress of the etching process and informs the operator of the current state by a warning sound or an error message.

After completing the etching process for a single wafer or a group of wafers, it checks whether there are variations of processing data for the next wafer or group of wafers (step S70). If there is no variation in the processing data, the etching process proceeds without change of the operational conditions of the cycling circuit 304. If there is variation in the processing data, it returns to the step S20 for inputting new processing data.

According to the inventive features described above, since the temperature-adjusting unit is operates over a wide range of temperatures (i.e., all over the high, intermediate, and low temperature), the substrate processing apparatus is able to etch various film materials under different temperature conditions, offering advanced processing capabilities.

As the temperature-adjusting unit 300 is operable over a wide range of temperatures, the apparatus 1 may be applicable to various processing fields such as etching, depositing, and photolithography. In addition, there may be no need for an operator to conduct tuning operations such as replacement of the expansion valves 332 even when the processing temperature required by the processing chamber 110 is changed due to variation of the film material to be etched, improving the rate of operation and reliability. Moreover, with the fine adjustment for the temperature of cooling fluid by the plurality of refrigerant vapor lines, it is possible to regulate the temperature of cooling fluid more precisely.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

That which is claimed is:

1. A substrate processing apparatus comprising:
   a processing room configured for treatment of a semiconductor substrate by a process;
   a cooling unit positioned to cool the processing room, the cooling unit configured to convey cooling fluid; and
   a temperature-adjusting unit that alters the temperature of the cooling fluid supplied into the cooling unit;
   wherein the temperature-adjusting unit has a cycling circuit comprising:

a compressor configured to compress a refrigerant;

a condenser configured to condense the compressed refrigerant;

an expander configured to expand the condensed refrigerant, the expander including a plurality of expansion valves arranged in parallel;

an evaporator configured to evaporate the expanded refrigerant, the evaporator positioned to cool the cooling fluid; and a plurality of refrigerant vapor lines arranged in parallel and positioned to connect a line that connects the compressor to the condenser to a line that connects the expander to the evaporator, the plurality of refrigerant vapor lines configured to directly supply some of the compressed refrigerant to the evaporator;

a plurality of control valves, wherein at least one control valve is positioned between the condenser and each of the expansion valves and wherein at least one control valve is positioned on each of the refrigerant vapor lines; and an adjuster configured to control the control valves.

2. The substrate processing apparatus of claim 1, further comprising:

a plurality of control valves, wherein at least one control valve is positioned between the condenser and each of the expansion valves; and an adjuster configured to control the control valves.

3. The substrate processing apparatus of claim 1, further comprising a controller configured to transfer control information to the adjuster, wherein the controller comprises:

a memory device configured to store a plurality of data sets, each of which includes processing conditions and control information to control the cycling circuit, the control information corresponding to the processing conditions;

an input unit configured to accept processing data corresponding to the process conducted in the processing chamber; and a processor configured to identify the data set that includes the processing conditions corresponding to the processing data.

4. The substrate processing apparatus of claim 1, wherein the refrigerant vapor lines have the same capacity for supplying the refrigerant vapor.

5. The substrate processing apparatus of claim 1, wherein the processing room comprises:

a supporting member positioned to support the semiconductor substrate, the supporting member connected to the cooling unit and to electrodes to which high-frequency power is applied; and an ejecting member configured to eject processing gas into the room, the ejecting member connected to the cooling unit and to the top electrode to which the high-frequency power is applied;

wherein the temperature-adjusting unit further comprises:

a first regulator that alters the temperature of the cooling fluid supplied to the supporting member; and a second regulator that alters the temperature of the cooling fluid supplied to the ejecting member.

6. The substrate processing apparatus of claim 1, wherein the expansion valves have different capacities for supplying the refrigerant.

7. The substrate processing apparatus of claim 1, wherein the process conducted in the processing room is an etching process.

8. A substrate processing apparatus comprising:

a processing room in which a semiconductor substrate is treated by a process;

a cooling unit positioned to cool the processing room, the cooling unit configured to convey cooling fluid;

a cycling circuit to compress, condense, expand, and evaporate a refrigerant, the cycling circuit positioned to alter the temperature of the cooling unit;

an adjuster configured to control operational conditions of the cycling circuit; and a controller configured to transfer control information to the adjuster, wherein the controller comprises a memory device configured to store a plurality of data sets, each of which includes processing conditions and control information to control the cycling circuit, the control information corresponding to the processing conditions of the processing room;

wherein the cycling circuit further comprises:

a compressor configured to compress the refrigerant;

a condenser configured to condense the compressed refrigerant;

an expander including a plurality of expansion valves arranged in parallel to expand the condensed refrigerant;

an evaporator configured to evaporate the expanded refrigerant by way of heat exchange with the cooling fluid; and a plurality of refrigerant vapor lines arranged in parallel and positioned to connect a line that connects the compressor to the condenser to a line that connects the expander to the evaporator, the plurality of refrigerant vapor lines configured to directly supply some of the compressed refrigerant to the evaporator;

wherein the control information includes information about the refrigerant vapor lines used for the process;

wherein the processing conditions include processing temperature of the processing room and the control information includes information about the expansion valve used for the process.

9. The substrate processing apparatus of claim 8, wherein the controller comprises:

an input unit configured to accept processing data corresponding to the process conducted in the processing room; and a processor configured to identify the data set that includes the processing conditions corresponding to the processing data.

10. The substrate processing apparatus of claim 9, wherein the processing room further comprises a power supply unit to supply high-frequency power to electrodes, and wherein the processing conditions include information about the high-frequency power applied during a process.

11. The substrate processing apparatus of claim 10, wherein the information about the high-frequency power includes at least one of the high-frequency power, the number of times of applying the high-frequency power, and the total period of applying the high-frequency power.

12. The substrate processing apparatus of claim 9, which further comprises a temperature sensor measuring practical processing temperature from the processing room, wherein the control information includes information about a permissible range of processing temperature.

13. The substrate processing apparatus of claim 8, wherein the processing temperature is the temperature on the semiconductor substrate.

14. The substrate processing apparatus of claim 8, which further comprises:

a tank connected with the cooling unit; and a heater providing heat to the tank, wherein the evaporator is disposed in or adjacent to the tank, and wherein the control information includes information about the heat applied to the tank from the heater during the process.

15. The substrate processing apparatus of claim 14, wherein the processing room further comprises:
a supporting member positioned to support the semiconductor substrate, the supporting member connected to the cooling unit; and
a temperature sensor disposed on the supporting member that measures temperature from the semiconductor substrate,
wherein the adjuster controls the heater in a closed loop scheme to maintain the semiconductor substrate at the processing temperature in accordance with a value measured by the temperature sensor.

16. The substrate processing apparatus of claim 15, wherein the closed loop scheme is a proportional integral derivative control mode.

17. The substrate processing apparatus of claim 8, wherein the expansion valves are different in capacity for supplying the refrigerant to the evaporator.

18. A method of regulating temperature in a substrate processing apparatus, the method comprising:
establishing a plurality of data sets, each of which includes processing conditions and control information to control operational conditions of a cycling circuit that alters the temperature of cooling fluid supplied into a processing room in accordance with each processing condition;
inputting processing data relevant to a process conducted in the processing room;
identifying the data set that includes the processing condition corresponding to the processing data;
transferring the control data of the identified data set to an adjuster controlling the cycling circuit;
adjusting the operational condition of the cycling circuit with the adjuster in accordance with the transferred control information; and
supplying the cooling fluid, which has exchanged heat with a refrigerant of the cycling circuit, into the processing room and conducting the process for a semiconductor substrate in the processing room;
wherein the cycling circuit comprises a compressor, a condenser, an expander, and an evaporator, the expander including a plurality of expansion valves arranged in parallel,
wherein the processing conditions include processing temperature during the process and the control information includes information about the expansion valve used for the process;
wherein the cycling circuit further comprises a plurality of refrigerant vapor lines arranged in parallel and positioned to connect a line that connects the compressor to the condenser to a line that connects the expander to the evaporator, the plurality of refrigerant vapor lines configured to directly supply some of the compressed refrigerant to the evaporator; and
wherein the control information includes information about the refrigerant vapor lines used for the process.

19. The method of claim 18, wherein the expansion valves are different in capacity for supplying the refrigerant to the evaporator.

20. The method of claim 18, wherein the refrigerant vapor lines are same in diameter, and
wherein the information about the refrigerant vapor lines used for the process includes information about the number of the refrigerant vapor lines.

21. The method of claim 18, wherein the processing conditions further include information about the high-frequency power applied during the process.

22. The method of claim 21, wherein the information about the high-frequency power includes at least one of the high-frequency power, the number of times of applying the high-frequency power, and the total period of applying the high-frequency power.

23. A temperature-adjusting unit used in a substrate processing apparatus, comprising:
a compressor configured to compress a refrigerant;
a condenser configured to condense the compressed refrigerant;
a plurality of expansion valves arranged in parallel to expand the condensed refrigerant; and
an evaporator configured to evaporate the expanded refrigerant by way of heat exchange with cooling fluid employed in a process external to the temperature adjusting unit,
wherein the expansion valves are selectively used in accordance with temperature required by cooling fluid;
a plurality of refrigerant vapor lines positioned to connect a line that connects the compressor to the condenser to a line that connects the expander to the evaporator, the refrigerant vapor lines configured to directly supply some of the compressed refrigerant to the evaporator.

24. The temperature-adjusting unit of claim 23,
wherein the plurality of the refrigerant vapor lines are selectively used in accordance with temperature required by cooling fluid.

25. The temperature-adjusting unit of claim 24, wherein the refrigerant vapor lines are configured to have the same diameter.

26. The temperature-adjusting unit of claim 23, wherein the expansion valves are different from each other in refrigerant supply amount.

27. A temperature-adjusting unit used in a substrate processing apparatus, comprising: a compressor configured to compress a refrigerant; a condenser configured to condense the compressed refrigerant; an evaporator configured to evaporate the expanded refrigerant by way of heat exchange with cooling fluid employed in a process external to the temperature-adjusting unit; and a plurality of refrigerant vapor lines positioned to connect a line that connects the compressor to the condenser to a line that connects the expander to the evaporator, each of the refrigerant vapor lines configured to directly supply some of the compressed refrigerant to the evaporator.

* * * * *